United States Patent
Zhan et al.

(10) Patent No.: US 7,288,996 B2
(45) Date of Patent: Oct. 30, 2007

(54) APPARATUS AND METHOD REDUCING NON-LINEARITY IN AN OUTPUT SIGNAL OF AN AMPLIFIER DEVICE

(75) Inventors: Jing-Hong C Zhan, Hillsboro, OR (US); Stewart S. Taylor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 169 days.

(21) Appl. No.: 11/186,296

(22) Filed: Jul. 21, 2005

(65) Prior Publication Data
US 2007/0018730 A1    Jan. 25, 2007

(51) Int. Cl.
*H03F 3/04*    (2006.01)
(52) U.S. Cl. ........................ 330/311; 330/289
(58) Field of Classification Search ............ 330/285, 330/289, 296, 311
See application file for complete search history.

(56) References Cited

U.S. PATENT DOCUMENTS 3,803,505 A * 4/1974 Ishigaki et al. .............. 330/254
6,724,259 B2 * 4/2004 Tanabe ........................ 330/311

* cited by examiner

*Primary Examiner*—Khanh Van Nguyen
(74) *Attorney, Agent, or Firm*—Law Office of Donald D Mondul; Donald D Mondul

(57) ABSTRACT

An apparatus reducing non-linearity in an output signal presented at an output locus of an amplifier device having an output unit coupled with the output locus, the output unit having at least one first operating characteristic contributing to the non-linearity, includes a compensating unit coupled with the output locus. The compensating unit has at least one second operating characteristic cooperating with the at least one first operating characteristic to effect the reducing.

14 Claims, 3 Drawing Sheets

10

APPARATUS AND METHOD REDUCING NON-LINEARITY IN AN OUTPUT SIGNAL OF AN AMPLIFIER DEVICE

BACKGROUND

When designing an amplifier device for which it is desired there be a substantially linear output signal at the output locus of the amplifier, one may find that linearity of the device is significantly affected by output conductance non-linearity of a transistor coupled with the output locus. For many high linearity amplifier circuits, a significant contributing factor to such output conductance non-linearity is characterized by intermodulation distortion. In particular, third order intermodulation distortion ($IM_3$) is particularly involved in creating unwanted non-linearity in output signals from an amplifier.

There is a need for an apparatus and method for improving reduction of non-linearity of output signals at an output locus of an amplifier device.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
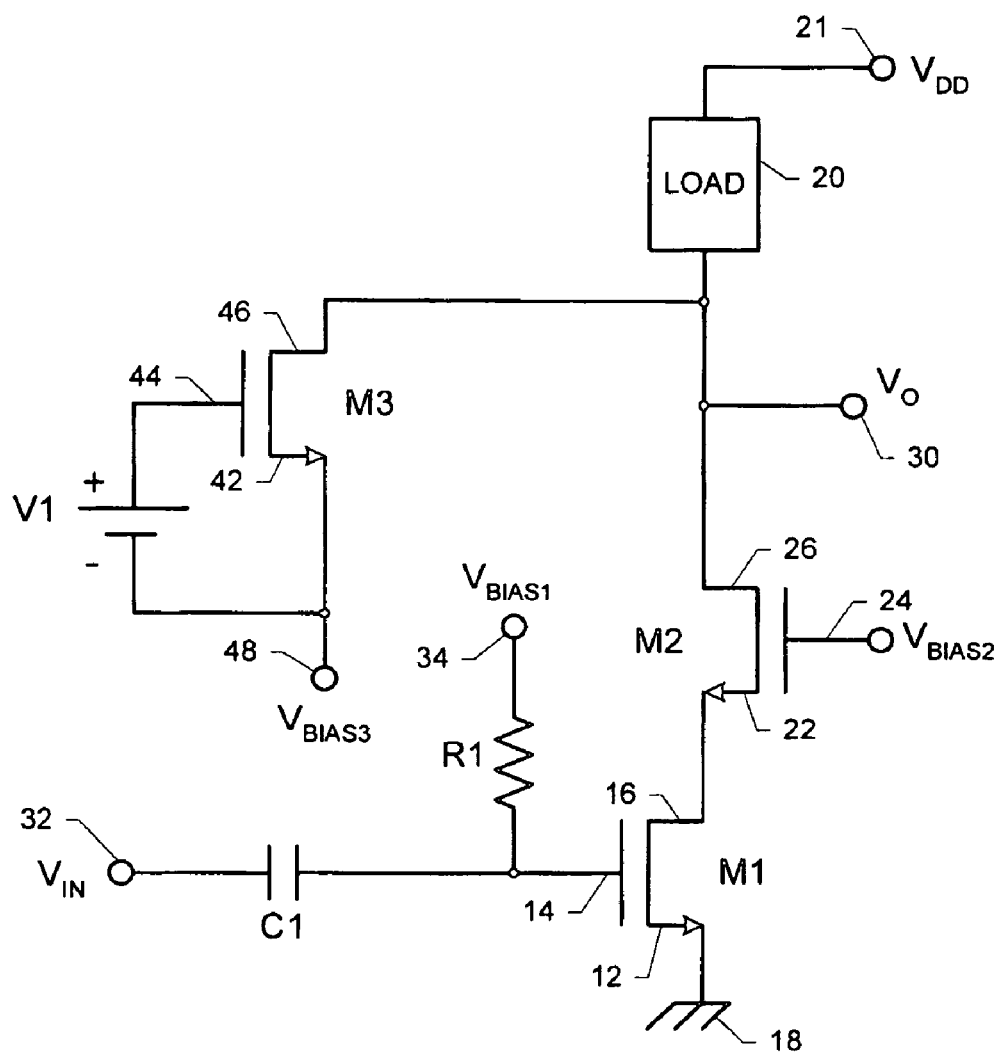
FIG. 1 is an electrical schematic diagram of a first embodiment of the apparatus of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

It should be understood that embodiments of the present invention may be used in a variety of applications. Although the present invention is not limited in this respect, the devices disclosed herein may be used in many apparatuses such as in the transmitters and receivers of a radio system.

Radio systems intended to be included within the scope of the present invention include, by way of example only, cellular radiotelephone communication systems, satellite communication systems, two-way radio communication systems, one-way pagers, two-way pagers, personal communication systems (PCS), personal digital assistants (PDA's), wireless local area networks (WLAN), personal area networks (PAN, and the like).

Types of cellular radiotelephone communication systems intended to be within the scope of the present invention include, although not limited to, Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, and the like.

By way of example and not by way of limitation in the case of an NMOS (N-channel Metal Oxide Semiconductor) transistor coupled with an output locus of a low noise amplifier device such as a cascode amplifier device, $IM_3$ may be dominated by third order drain conductance ($g_{d3}$) of the NMOS transistor coupled with the output locus. In such an exemplary configuration, the drain-to-source current ($i_{ds}$) of the NMOS transistor may be expressed as, $$i_{ds} = I_{DC} + (g_{d1} \cdot v_{ds}) + \frac{1}{2!}(g_{d2} \cdot v_{ds}^2) + \frac{1}{3!}(g_{d3} \cdot v_{ds}^3) + \ldots + \frac{1}{n!}(g_{dn} \cdot v_{ds}^n) \quad [1]$$

where, $i_{ds}$=drain-to-source current;
$I_{DC}$=DC current applied to the transistor;
$g_{dn}$=nth order drain conductance; and
$V_{ds}$=drain-to-source voltage.

FIG. 1 is an electrical schematic diagram of a first embodiment of the apparatus of the present invention. In FIG. 1, a cascode amplifier device 10 includes a first transistor device M1 coupled in series with an output unit such as a second transistor device M2. In the exemplary embodiment illustrated in FIG. 1, transistor device M1 may be an NMOS transistor having a source 12, a gate 14 and a drain 16. Transistor device M2 may also be an NMOS transistor having a source 22, a gate 24 and a drain 26. Source 12 may be coupled with a ground locus 18. Drain 16 may be coupled with source 22.

A load 20 may be coupled with drain 26. Load 20 may also be coupled with a supply voltage $V_{DD}$ provided at a supply voltage locus 21. An output voltage $V_O$ is provided at an output locus 30; output locus 30 is coupled with drain 26.

An input locus 32 is coupled with gate 14 via a capacitor C1. A resistor R1 is coupled between gate 14 and a bias voltage locus 34. A bias voltage $V_{BIAS1}$ is applied at bias voltage locus 34. Capacitor C1 may be employed as part of an input matching network or as a DC blocking coupling capacitor. Resistor R1 may be employed as a bias resistor.

Transistor M2 may be coupled with output locus 30, so third order intermodulation distortion ($IM_3$) of transistor M2 may be involved in creating unwanted non-linearity in output signals appearing at output locus 30, as described earlier herein. As also mentioned earlier herein, $IM_3$ of transistor M2 may be dominated by third order drain conductance ($g_{d3}$) of transistor M2.

Any non-linear term $g_{dn}$ in expression [1] above may be compensated for by connecting a suitably configured compensating unit in parallel with output locus 30. By way of example and not by way of limitation, a compensating unit may be embodied in a transistor device M3 coupled in parallel with output locus 30 and is configured for compensating non-linear terms $g_{dn}$ occurring in drain 26.

Transistor device M3 may be an NMOS transistor having a source 42, a gate 44 and a drain 46. Source 42 may be coupled with a bias voltage locus 48 at which a bias voltage $V_{BIAS3}$ may be applied. Drain 46 may be coupled with output locus 30. A voltage source V1 may be applied to source 42 and drain 44 to bias transistor device M3.

By way of example and not by way of limitation, transistor device M3 may be suitably sized and suitably biased for operation in its triode region to generate a $g_{dn}$ of opposite sign to a $g_{dn}$ of transistor M2. By way of further example and not by way of limitation, transistor M3 may be suitably sized and suitably biased for operation in its triode region to generate a $g_{d3}$ of opposite sign to $g_{d3}$ of transistor M2 to reduce non-linearity in output signals presented at output locus 30.

Figure 2:
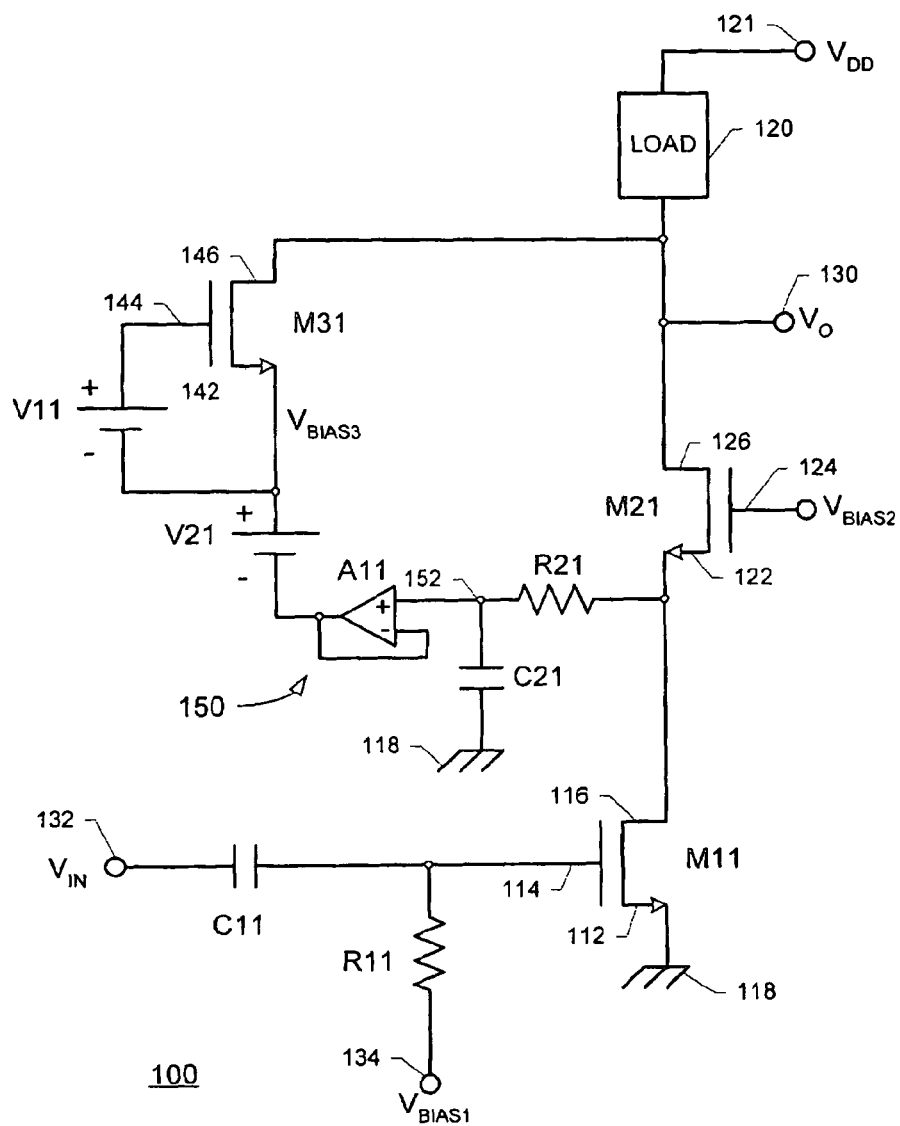
FIG. 2 is an electrical schematic diagram of a second embodiment of the apparatus of the present invention.

FIG. 2 is an electrical schematic diagram of a second embodiment of the apparatus of the present invention. In FIG. 2, a cascode amplifier device 100 includes a first transistor device M11 coupled in series with an output unit such as a second transistor device M21. In the exemplary embodiment illustrated in FIG. 2, transistor device M11 may be an NMOS transistor having a source 112, a gate 114 and a drain 116. Transistor device M21 may also be an NMOS transistor having a source 122, a gate 124 and a drain 126. Source 112 may be coupled with a ground locus 118. Drain 116 may be coupled with source 122.

A load 120 may be coupled with drain 126. Load 120 may also be coupled with a supply voltage $V_{DD}$ provided at a supply voltage locus 121. An output voltage $V_O$ is provided at an output locus 130; output locus 130 is coupled with drain 126.

An input locus 132 is coupled with gate 114 via a capacitor C11. A resistor R11 is coupled between gate 114 and a bias voltage locus 134. A bias voltage $V_{BIAS1}$ is applied at bias voltage locus 134. Capacitor C11 may be employed as part of an input matching network or as a DC blocking coupling capacitor. Resistor R11 may be employed as a bias resistor.

Transistor M21 may be coupled with output locus 130, so third order intermodulation distortion ($IM_3$) of transistor M21 may be involved in creating unwanted non-linearity in output signals appearing at output locus 130, as described earlier herein. As also mentioned earlier herein, $IM_3$ of transistor M21 may be dominated by third order drain conductance ($g_{d3}$) of transistor M21.

Any non-linear term $g_{dn}$ in expression [1] above may be compensated for by connecting a suitably configured compensating unit in parallel with output locus 130. By way of example and not by way of limitation, a compensating unit may be embodied in a transistor device M31 coupled in parallel with output locus 130 and is configured for compensating non-linear terms $g_{dn}$ occurring in drain 126.

Transistor device M31 may be an NMOS transistor having a source 142, a gate 144 and a drain 146. Source 142 may be coupled with a bias voltage circuit 150. Bias voltage circuit 150 may include a resistor R21 and a capacitor C21 coupled with source 122 to operate as a low pass filter to sense the DC value of output voltage $V_O$. An amplifier A11 may be coupled with resistor R21 and capacitor C21 to receive a filtered signal from resistor R21 and capacitor C21.

Amplifier A11 may have a unity gain and may present an output signal to a voltage source V21. Drain 146 may be coupled with output locus 130. Voltage source V21 may be applied to source 142. A voltage source V11 may be applied to source 142 and drain 144. Bias voltage circuit 150 may cooperate with voltage sources V11, V21 to provide a bias voltage $V_{BIAS3}$ to source 142 and to bias transistor device M31.

By way of example and not by way of limitation, transistor device M31 may be suitably sized and suitably biased for operation in its triode region to generate a $g_{dn}$ of opposite sign to a $g_{dn}$ of transistor M21. By way of further example and not by way of limitation, transistor M31 may be suitably sized and suitably biased for operation in its triode region to generate a $g_{d3}$ of opposite sign to $g_{d3}$ of transistor M21 to reduce non-linearity in output signals presented at output locus 130.

Figure 3:
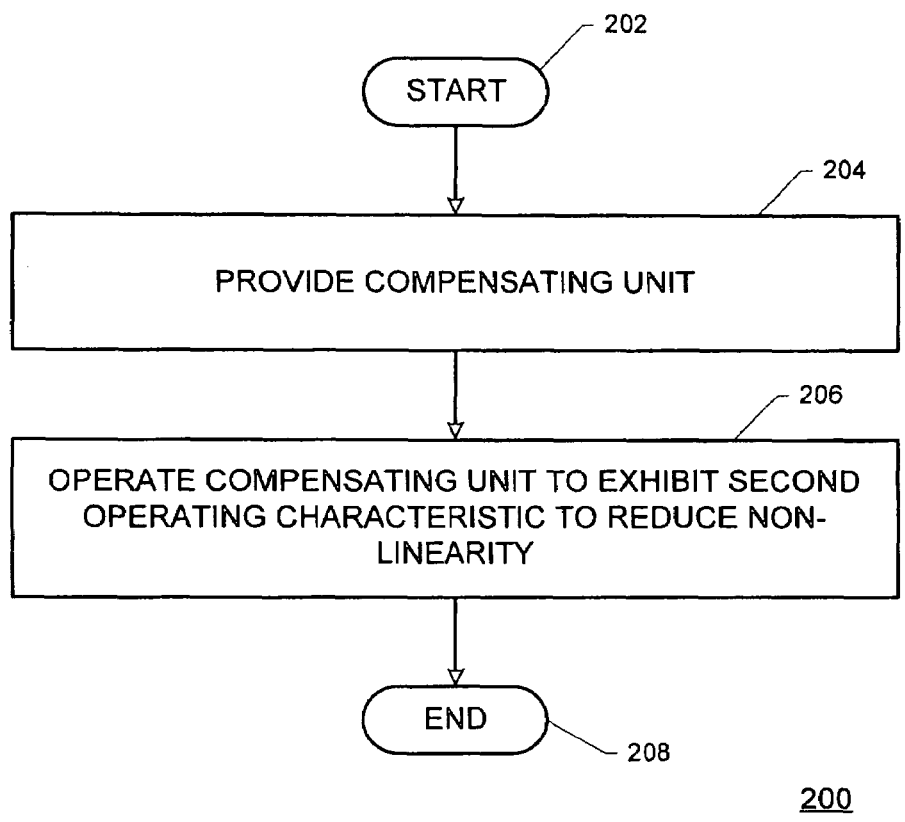
FIG. 3 is a flow diagram illustrating the method of the present invention.

FIG. 3 is a flow diagram illustrating the method of the present invention. In FIG. 3, a method 200 reducing non-linearity in an output signal presented at an output locus of an amplifier device begins at a START locus 202. The amplifier device may have an output transistor unit coupled with the output locus. The transistor unit may have at least one first operating characteristic contributing to the non-linearity. Method 200 continues by providing a compensating unit coupled with the output locus, as indicated by a block 204. Method 200 continues by operating the compensating unit to exhibit at least one second operating characteristic cooperating with the at least one first operating characteristic to effect the reducing, as indicated by a block 206. Method 200 terminates at an END locus 208.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. An apparatus reducing non-linearity in an output signal presented at an output locus of an amplifier device; said amplifier device having an output unit coupled with said output locus; said output unit having at least one first operating characteristic contributing to said non-linearity; the apparatus comprising a compensating unit coupled with said output locus; said compensating unit having at least one second operating characteristic cooperating with said at least one first operating characteristic to effect said reducing; said output unit being a CMOS transistor unit; said compensating unit including a compensating CMOS transistor unit configured for operating in the triode region.

2. An apparatus reducing non-linearity in an output signal presented at an output locus of an amplifier device as recited in claim 1 wherein said compensating unit is coupled in parallel with said output locus.

3. An apparatus reducing non-linearity in an output signal at an output locus of an amplifier device; said amplifier device having an output unit coupled with said output locus; said output unit having at least one first operating characteristic contributing to said non-linearity; the apparatus comprising a compensating field effect transistor unit coupled in parallel with said output locus; said compensating field effect transistor unit operating in a triode region and having at least one second operating characteristic cooperating with said first operating characteristic to effect said reducing.

4. An apparatus reducing non-linearity in an output signal at an output locus of an amplifier device as recited in claim 3 wherein said first operating characteristic is related with nth order intermodulation distortion by said output unit.

5. An apparatus reducing non-linearity in an output signal at an output locus of an amplifier device as recited in claim 4 wherein said first operating characteristic is third order conductance having a first value and a first sign and wherein said second operating characteristic is third order conductance having a second value and a second sign; said first value and said second value being substantially equal; said first sign and said second sign being substantially opposite.

6. An apparatus reducing non-linearity in an output signal at an output locus of an amplifier device as recited in claim 3 wherein said first operating characteristic is related with nth order intermodulation distortion by said output unit.

7. An apparatus reducing non-linearity in an output signal at an output locus of an amplifier device as recited in claim 6 wherein said first operating characteristic is third order conductance having a first value and a first sign and wherein said second operating characteristic is third order conductance having a second value and a second sign; said first value and said second value being substantially equal; said first sign and said second sign being substantially opposite.

8. A method reducing non-linearity in an output signal presented at an output locus of an amplifier device; said amplifier device having a CMOS transistor output unit coupled with said output locus; said output unit having at least one first operating characteristic contributing to said non-linearity; the method comprising:
   (a) providing a CMOS transistor compensating unit coupled with said output locus; and
   (b) operating said CMOS transistor compensating unit in the triode region to exhibit at least one second operating characteristic cooperating with said at least one first operating characteristic to effect said reducing.

9. A method reducing non-linearity in an output signal presented at an output locus of an amplifier device as recited in claim 8 wherein said compensating unit is coupled in parallel with said output locus.

10. A method for reducing non-linearity in an output signal at an output locus of an amplifier device having an output unit coupled with said output locus; said output unit having at least one first operating characteristic contributing to said non-linearity; the method comprising:
   (a) providing a compensating field effect transistor unit coupled in parallel with said output locus; and
   (b) operating said compensating field effect transistor unit in the triode region to exhibit at least one second operating characteristic cooperating with said first operating characteristic to effect said reducing.

11. A method reducing non-linearity in an output signal at an output locus of an amplifier device as recited in claim 10 wherein said first operating characteristic is related with nth order intermodulation distortion by said output unit.

12. A method reducing non-linearity in an output signal at an output locus of an amplifier device as recited in claim 11 wherein said first operating characteristic is third order conductance having a first value and a first sign and wherein said second operating characteristic is third order conductance having a second value and a second sign; said first value and said second value being substantially equal; said first sign and said second sign being substantially opposite.

13. A method reducing non-linearity in an output signal at an output locus of an amplifier device as recited in claim 10 wherein said first operating characteristic is related with nth order intermodulation distortion by said output unit.

14. A method reducing non-linearity in an output signal at an output locus of an amplifier device as recited in claim 13 wherein said first operating characteristic is third order conductance having a first value and a first sign and wherein said second operating characteristic is third order conductance having a second value and a second sign; said first value and said second value being substantially equal; said first sign and said second sign being substantially opposite.

* * * * *

UNITED STATES PATENT AND TRADEMARK OFFICE
CERTIFICATE OF CORRECTION

PATENT NO. : 7,288,996 B2 Page 1 of 1
APPLICATION NO. : 11/186296
DATED : October 30, 2007
INVENTOR(S) : Zhan et al.

It is certified that error appears in the above-identified patent and that said Letters Patent is hereby corrected as shown below:

Column 5, line 62, in Claim 3, delete "a" and insert -- the --, therefor.

Signed and Sealed this

Eleventh Day of March, 2008

JON W. DUDAS
*Director of the United States Patent and Trademark Office*